United States Patent [19]

Endo

[11] Patent Number: 4,777,558
[45] Date of Patent: Oct. 11, 1988

[54] ELECTRONIC DEVICE

[75] Inventor: Kazuyoshi Endo, Iide, Japan

[73] Assignee: Marcon Electronics Co., Ltd., Nagai, Japan

[21] Appl. No.: 111,066

[22] Filed: Oct. 22, 1987

[30] Foreign Application Priority Data

Oct. 23, 1986 [JP] Japan .................. 61-253160

[51] Int. Cl.⁴ ............................................ H01G 1/14
[52] U.S. Cl. .................................................. 361/306
[58] Field of Search ........ 361/433 C, 433 T, 308–310, 361/306, 402–404; 29/25, 42, 619; 338/327–329, 22 R

[56] References Cited

U.S. PATENT DOCUMENTS

| | | | |
|---|---|---|---|
| 2,219,365 | 10/1940 | Janssen | 338/329 X |
| 2,999,996 | 9/1961 | Berni | 338/329 |
| 3,424,952 | 1/1969 | Vierow | 361/433 C |
| 3,446,912 | 5/1969 | Diehl et al. | 338/329 X |
| 3,614,561 | 10/1971 | Behn | 29/25.42 X |
| 3,693,244 | 9/1972 | Behn et al. | 29/492 |
| 3,710,211 | 1/1973 | Behn et al. | 361/309 |
| 4,114,120 | 9/1978 | Lupfer | 361/306 X |
| 4,356,608 | 11/1982 | Behn | 29/25.42 |
| 4,656,556 | 4/1987 | Westermann | 361/307 |
| 4,656,557 | 4/1987 | Behn et al. | 361/309 |

FOREIGN PATENT DOCUMENTS

| | | | |
|---|---|---|---|
| 575697 | 5/1933 | Fed. Rep. of Germany | 361/310 |
| 49423 | 10/1940 | Netherlands | 361/308 |

Primary Examiner—Donald A. Griffin
Attorney, Agent, or Firm—Oblon, Fisher, Spivak, McClelland & Maier

[57] ABSTRACT

This invention relates to an improvement in a terminal connecting portion in an electronic device such as a capacitor having a plate or strip terminal. An electronic device has a device body. An insulator is formed on at least one portion of the outer surface of the device body. A pair of electrode layers are formed on the insulator. They are made of conductive material. A pair of plate or strip terminals having flat surfaces overlaid on the electrode layers and connected to the device body by the electrode layer. Each of the terminals has a projection projecting from the flat surface, is embedded in the electrode layer, and is formed of conductive material having a higher melting point than that of the electrode layer.

17 Claims, 6 Drawing Sheets

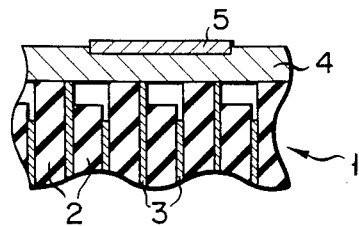
F I G. 1
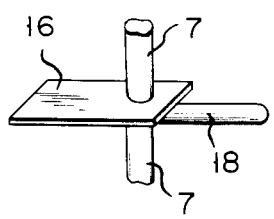
F I G. 4A
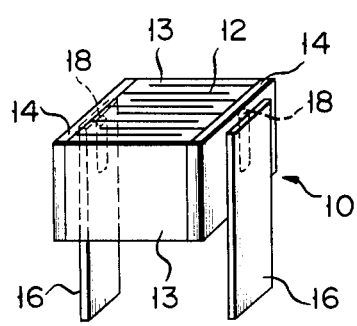
F I G. 2
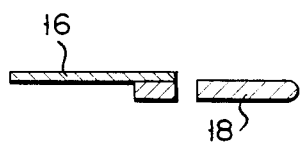
F I G. 4B
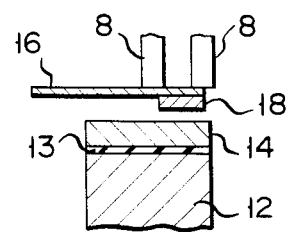
F I G. 4C
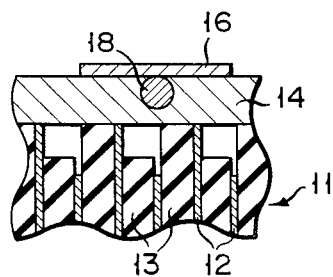
F I G. 3
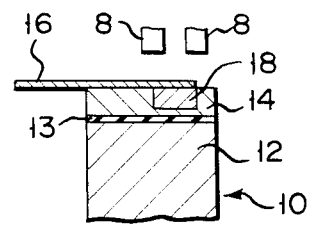
F I G. 4D

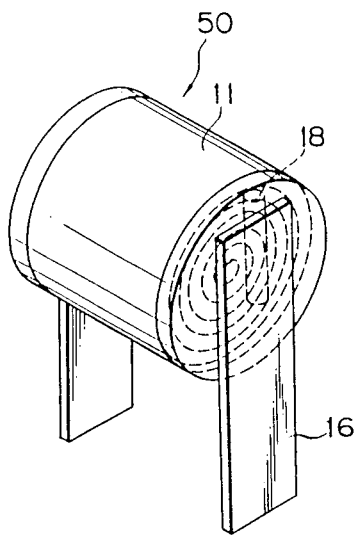
F I G. 16
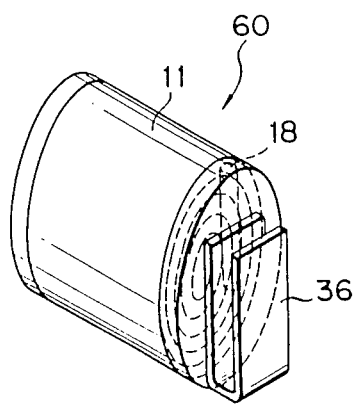
F I G. 17
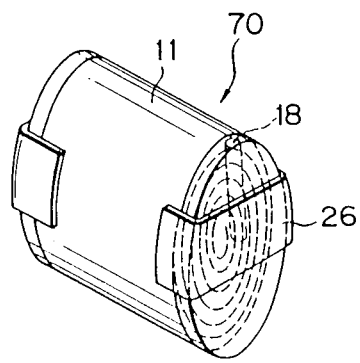
F I G. 18

ELECTRONIC DEVICE

BACKGROUND OF THE INVENTION

The present invention relates to an electronic device having a pair of plate or strip terminals and, more particularly, to an improvement in the pair of terminals of an electronic device such as a capacitor and a resistor.

Along with a recent increase in the packaging density of electronic circuits, the electronic devices incorporated in the circuit have become small. In particular, it is demanded that electronic devices, which are to be mounted on a printed circuit board, be compact. For this reason, the pair of terminals of each electronic device must be designed to be suitable for high-density mounting.

Under these circumstances, an electronic device having a pair of plate or strip terminals recently replaces an electronic device having a pair of metal wire terminals or round metal rod terminals. More specifically, a pair of plate or strip terminals are mounted along a device body to make the entire device compact. In order to realize still higher density mounting, a leadless electronic device (so-called a chip type electronic device) on which a pair of terminals are mounted along a device body, not extending from the device body, is already available.

FIG. 1 shows a conventional electronic device, e.g., a capacitor. This capacitor has capacitor element 1 in which insulating films 2 and deposition metal layers 3 are alternately stacked, and sprayed metal layer 4 formed of a low-melting point metal is formed on capacitor element 1. A pair of plates or strip terminals 5 are overlaid and connected to capacitor element 1 by spot-welding or soldering through metal layer 4.

When terminal 5 is spot-welded, resistive heating occurs at the contact surfaces thereof since terminal 5 is energized while being urged against metal layer 4, and the surface of metal layer 4 is slightly melted. As a result, terminal 5 is slightly embedded in metal layer 4.

When terminal 5 is soldered, a solder is heated and melted at about 360° C., and terminal 5 is placed on the melted solder.

However, the capacitor in which terminal 5 is welded to metal layer 4 of the capacitor element has the following drawbacks (1) to (4).

(1) Since its welding strength is low, terminal 5 is easily peeled from metal layer 4.

(2) If a welding current is increased to improve a welded joint strength, insulating films 2 arranged below metal layer 4 are deteriorated by the welding heat, reducing a contacting property with corresponding deposition metal layer 4, and dielectric loss tangent tan$\delta$ of the capacitor increases.

(3) In order to prevent deterioration of insulating films 2 due to heating, metal layer 4 must be much thicker than is necessary for connecting terminal 5, and the capacitor is inevitably bulky.

(4) If metal layer 4 is melted and plate or strip terminal 5 is embedded in it in order to improve a welded joint strength, a molten metal projects and is scattered from the peripheral portion of terminal 5, changing the dimensions of the capacitor and impairing the outer appearance of the capacitor.

The capacitor, in which terminal 5 is soldered to metal layer 4 of the capacitor element, has the following drawbacks (1) to (4).

(1) Automation of manufacturing the capacitor is difficult to achieve, and a manual operation is required to produce the capacitor, resulting in low productivity.

(2) The manual operation is performed over a relatively long time, and the entire process is prolonged, resulting in high cost.

(3) Insulating films 2 below metal layer 4 are degraded due to heating during soldering, and dielectric loss tangent tan$\delta$ of the capacitor increases.

(4) In order to prevent degradation of insulating films 2 due to heating, metal layer 4 must be much thicker than is necessary for connecting terminal 5, and as a result, the capacitor becomes bulky.

SUMMARY OF THE INVENTION

It is an object of the present invention to provide a compact, lightweight electronic device which can connect a terminal and an electronic device body having a great strength, and can maintain dielectric loss tangent (tan$\delta$) at a small value.

According to an aspect of the present invention, an electronic device comprises: a device body, an insulator formed on at least one part of the outer surface of the device body, a pair of electrode layers formed of conductive material and laid on the insulator, and a pair of plate or strip terminals having flat surfaces overlaid on the electrode layers, respectively and connected to the device body, wherein each of the terminals has a projection projecting from the flat surface, is embedded in the electrode layer, and is formed of conductive material having a higher melting point than that of the electrode layer.

In this case, each of the terminals is preferably connected to the corresponding electrode layer by means of series spot-welding, and the projection is preferably formed of a metal wire welded to a flat surface of the terminal. In addition, the metal wire is preferably connected to the terminal by direct spot-welding.

When the electronic device with the above structure is manufactured, the projection is formed on one surface of the plate or strip terminal. The terminal is overlaid on the electrode layer so that the projection abuts against the electrode layer of the device body. A predetermined current is supplied to the electrode layer through the projection while urging a pair of parallel welding tips against the surface of the terminal at a predetermined pressure, so as to partially melt the electrode layer at the abutting portion. Then, the projection is pressed into the electrode layer under pressure. In this manner, the projection is embedded in the electrode layer, and the terminal and the device body will be strongly connected.

Since the terminal thus produced has at least one projection, it is not in surface contact with the electrode layer, but in point or linear contact therewith when it is placed on the device body. Therefore, only a portion of the electrode layer is heated and melted when the terminal is joined to the electrode layer through heat. As a result, the influence of heat to the insulator such as a metallized film under the electrode layer will be eliminated, the degree of degradation of the insulator due to heating can be decreased, and the dielectric loss tangent (tan$\delta$) of the electronic device will can be maintained at low level.

Since the projection is embedded in the electrode layer, the shape of a junction region is more complicated than in mere surface junction, and the terminal cannot be easily peeled from the electrode layer. Furthermore, since a contact area during welding is decreased, local heating of the electrode layer by a contact resistance will be easily achieved. Thus, the electrode layer will be instantaneously melted and solidified, thus improving a connection strength of the terminal.

BRIEF DESCRIPTION OF THE DRAWINGS

FIG. 1 is a partial sectional view showing a conventional electronic device;

FIG. 2 is a perspective view showing a plate or strip terminal connecting lead type stacked film capacitor according to a first embodiment of the present invention;

FIG. 3 is a partial sectional view of the capacitor according to the first embodiment;

FIGS. 4A to 4D are views for explaining steps in the manufacture of the capacitor according to the first embodiment, in which FIGS. 4C and 4D are partial sectional views taken along the stacked film of the capacitor;

FIGS. 16–18 are alternate embodiments of this invention.

DETAILED DESCRIPTION OF THE PREFERRED EMBODIMENTS

Figure 5:
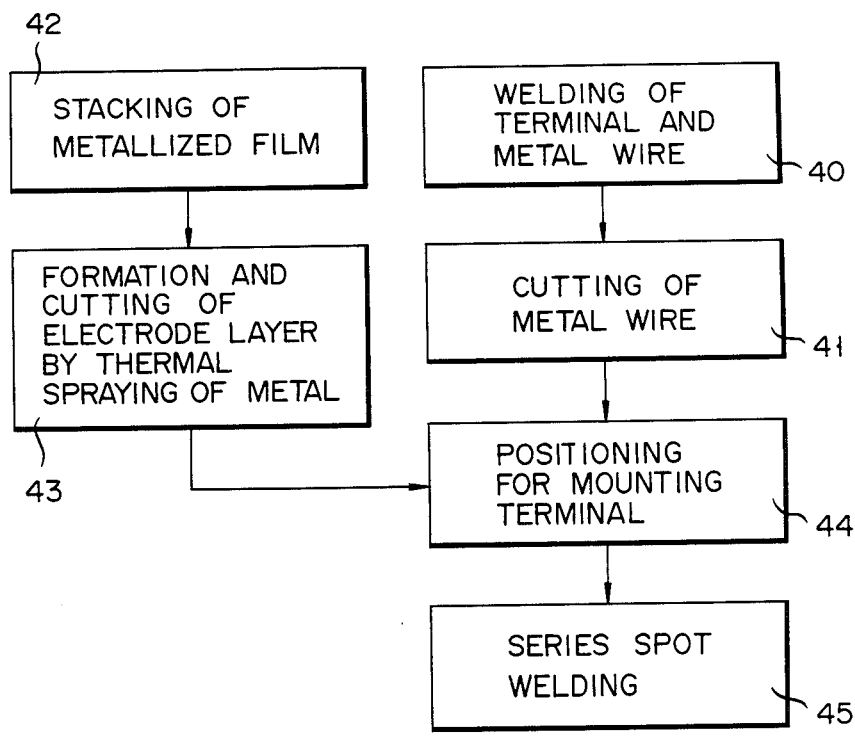
FIG. 5 is a chart showing the steps in the manufacture of the capacitor according to the first embodiment.

Various embodiments of the present invention will be described with reference to the accompanying drawings.

As shown in FIG. 2, an electronic device according to the first embodiment of the present invention is a square stacked metallized film capacitor having a connecting lead type strip terminal. Capacitor element 11 of capacitor 10 is formed into a substantially cubic shape by alternately stacking thin films. This metallized film is prepared by depositing a metal layer having 200 to 300 Å on one surface of insulating film 13 having a thickness of 2 to 12 μm. Insulating film 13 adopts a heat-resistive resin such as polyester, polyimide, polyphelene sulfide, and the like, and deposition metal layer 12 is formed of Zn, Al, Ni, or the like. Electrode layers 14 are respectively formed on a pair of opposing outer surfaces. In this manner, layers (metal layers 12 and insulating layers 13) of the metallized film are alternately connected to a pair of electrode layers 14. Each electrode layer 14 comprises a metal layer which is formed by thermal spraying to have a predetermined thickness. Note that capacitor element 11 may be of a columnar type.

A pair of strip terminals 16 are connected to capacitor element 11 through corresponding electrode layers 14 to sandwich element 11 therebetween and to be parallel to each other. More specifically, each of terminals 16 is connected with along a surface on which electrode layer 14 is formed. The length of each terminal 16 is larger than that of capacitor element 11, and one end extends from capacitor element 11. The extending portion of each terminal 16 corresponds to the connecting lead of the capacitor. Metal wire 18 as a projection is mounted on a flat surface of each terminal 16 near the end portion so that the longitudinal direction thereof coincides with that of terminal 16.

As shown in FIG. 3, strip terminal 16 is provided on corresponding electrode layer 14, and is connected thereto through metal wire 18. Metal wire 18 is a short piece of small wire, and is entirely embedded in electrode layer 14.

In the case described above, each electrode layer 14 comprises a 0.7 mm Sn-Pb alloy (solder) layer. As other metals used for the electrode layer, low-melting point metals such as Zn, Al, and the like are preferable. The thickness of the electrode layer preferably falls within the range of 0.3 to 1.5 mm, and more preferably falls within the range of 0.5 to 1.0 mm.

Each terminal 16 comprises a Be-Cu alloy strip having a thickness of 0.15 mm and a width of 3 mm. As other materials, a Cu-Zn alloy, Cu-Ni alloy, phosphor bronze, or solder-plated strips or plates thereof is preferable. In the case of the strip terminal, its thickness preferably falls within the range of 0.075 to 0.3 mm, and its width preferably falls within the range of 1.5 to 5 mm. In the case of the plate terminal, its thickness preferably falls within the range of 0.5 to 1.5 mm, and its width preferably falls within the range of 1.5 to 10 mm. In this case, these values may be appropriately changed depending on the shape, dimensions, and applications of the device.

Each metal wire 18 is formed of a material having a higher melting point than that of electrode layer 14, e.g., a Cu-coating mild steel wire (so-called copper ply wire; to be referred to as a CP wire hereinafter). Wire 18 has a diameter of 0.6 mm, and a length of about 3 to 5 mm. Other materials used for the metal wire include a Cu wire, an Ni wire, and the like. A diameter of the metal wire preferably falls within the range of 0.2 to 1.0 mm, and its length preferably falls within the range of 2 to 8 mm.

A case wherein the connecting lead type capacitor shown in FIG. 2 is manufactured will be described in detail with reference to FIGS. 4A to 4D and FIG. 5. As shown in FIG. 4A, in a spot welding machine having a pair of vertically opposing welding tips 7, plate terminal 16 and CP wire 18 are positioned by a fixing jig (not shown) of the welding machine. More specifically, CP wire 18 is overlapped on a connection surface of plate terminal 16 by about 3 to 5 mm, so that CP wire 18 is located at the center in the widthwise direction of terminal 16, and the overlaid portions are positioned to be sandwiched between welding tips 7. In this case, each welding tip 7 is a round tungsten rod having a diameter of 2 mm.

After positioning is performed as described above, terminal 16 and CP wire 18 are clamped between welding tips 7, and are compressed by energizing welding tips 7. Thus, terminal 16 and CP wire 18 are spot-welded (step 40). The welding conditions are summarized below.

energization time: 60 msec
pressure: 2.5 kg
peak voltage: 1.9 V
peak current: 800 A
effective current: 430 A
total heat input: 35 J After welding, the extending portion of CP wire 18 is cut off, as shown in FIG. 4B (step 41).

Aluminum is deposited on one surface of polyester film, thereby forming metalized film. The metalized film is cut into long strips of films having the same width. The strips of film are wound into rolls. Two strips of metalized film are fed from two rolls to a drum. They are wound around the drum, such that the first strip overlaps the second strip and is slightly staggered in the widthwise direction with respect to the second strip. They are repeatedly wound around the drum until they form a layer of a predetermined thickness on the drum (step 42). In this case, the diameter of the drum is 500 to 1,000 mm.

Next, an Sn-Pb-based solder is thermally sprayed onto a pair of opposing surfaces formed by the end portions in the widthwise direction of the stacked films, thereby forming 0.7 mm thick electrode layers 14. Then, the ring-shaped stacked film is cut into a predetermined length. The dimensions of the device body assembled as described above are about 7.5 mm×5 mm×3 mm.

As shown in FIG. 4C, the assembled device body is placed on a table (not shown) of the welding machine, so that each electrode layer 14 faces a pair of welding tips 8 of the spot welding machine. Meanwhile, terminal 16 is positioned so that CP wire 18 of terminal 16 faces the peripheral portion of corresponding electrode layer 14 (step 44). In this case, a pair of welding tips 8 are parallel electrodes having a predetermined interval, and can be simultaneously moved upward and downward.

Terminal 16 is moved downward together with parallel tips 8, and tips 8 are compressed and energized while CP wire 18 is urged against electrode layer 14. Thus, a Joule heat is generated by a contact resistance between CP wire 18 and electrode layer 14, and electrode layer 14 (in contact with CP wire 18) is partially melted. As a result, CP wire 18 sinks in electrode layer 14, and is entirely embedded therein, as shown in FIG. 4D. In this manner, terminal 16 and electrode layer 14 are in tight contact with each other over a wide area, and a contact area therebetween is increased (step 45). In this manner, each terminal 16 is connected to the device body while a total heat input to the device body upon connection is minimized.

In this case, a cross-section of each welding tip 8 is 1.0 mm×1.4 mm, and a gap between the electrodes is 0.2 mm. The conditions for the series spot-welding are summarized below.

energization time: 40 msec
pressure: 1.5 kg
peak voltage: 1.9 V
peak current: 580 A
effective current: 210 A
total heat input: 17 J In the first embodiment, a CP wire welded to the terminal is employed as a projection. However, the present invention is not limited to this. For example, a portion of the terminal is bulged to serve as a projection.

In the first embodiment, when the terminals are assembled, a single CP wire is connected to a single terminal. However, the present invention is not limited to this. For example, a pair of terminals may be connected to the two ends of a single CP wire, and thereafter, the wire may be cut into two pieces.

Figure 6:
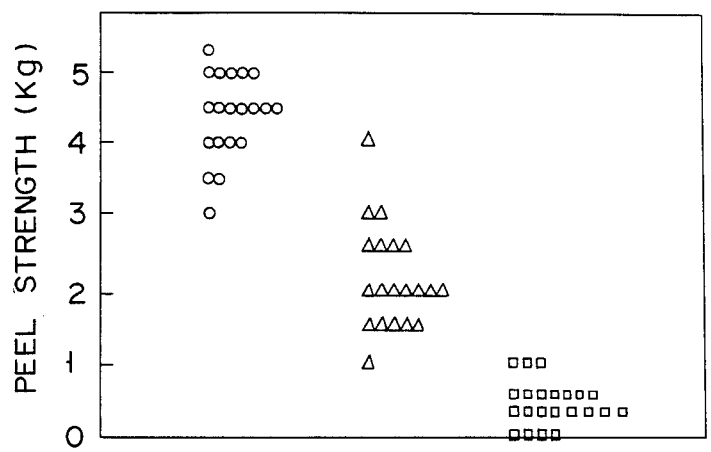
FIG. 6 is a graph for comparing peeling strengths of terminals in the capacitor of the present invention and in the conventional capacitor.

FIG. 6 is a distribution graph showing examination results of a peel strength of each terminal wherein a force required for peeling the terminal from the device body (i.e., a peel strength) is plotted along the ordinate, and connection types of terminals in metallized film capacitors having the identical rated capacitance are altered. In FIG. 6, circles indicate peel strengths of the terminals according to the present invention, triangles indicate peel strengths of soldered conventional terminals, and squares indicate peel strengths of directly welded conventional terminals, respectively.

As can be seen from FIG. 6, the terminals of the present invention have a high peel strength of about 3 to 5 kg. However, the soldered conventional terminals have a low peel strength of about 1.5 to 3.0 kg, and almost all the directly welded conventional terminals have only a peel strength of 0.5 kg or lower.

Figure 7:
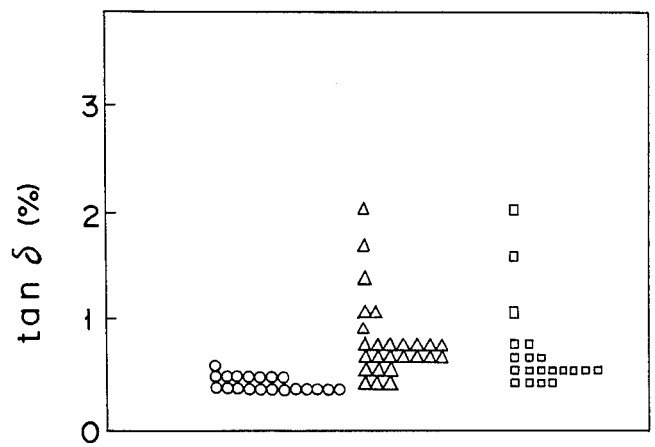
FIG. 7 is a graph for comparing dielectric loss tangents (tan$\delta$) of the capacitor of the present invention and the conventional capacitor.

FIG. 7 is a distribution graph showing examination results of $\tan\delta$ of each capacitor wherein a dielectric loss tangent ($\tan\delta$) of a capacitor is plotted along the ordinate, and connection types of terminals in metallized film capacitors having the identical rated capacitance are altered. In FIG. 7, circles indicate $\tan\delta$ of capacitors according to the present invention, triangles indicate $\tan\delta$ of capacitors having soldered conventional terminals, and squares indicate $\tan\delta$ of capacitors having directly welded conventional terminals, respectively.

As can be seen from FIG. 7, almost all the conventional capacitors exhibit $\tan\delta$ of about 0.5 to 1.0%, and the remainders exhibit $\tan\delta$ exceeding about 1.0%. In contrast to this, in the capacitors of the present invention, $\tan\delta$ can be maintained at low level of about 0.5%.

Figure 8:
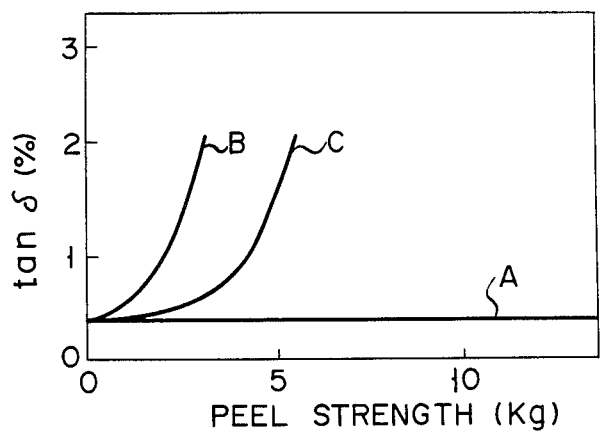
FIG. 8 is a graph for comparing the relationship between the peeling strength and the dielectric loss tangent in the capacitor of the present invention and in the conventional capacitor.

FIG. 8 is a graph showing examination results of the relationship between the peel strength and the dielectric loss tangent in the respective capacitors wherein the peel strength of a terminal is plotted along the abscissa, dielectric loss tangent $\tan\delta$ is plotted along the ordinate, and connection types of terminals in metallized film capacitors having the identical rated capacitance are altered. In FIG. 8, curve "A" represents a result of a capacitor of the present invention, curve "B" represents a result of a conventional capacitor in which a terminal is directly welded to a capacitor element, and curve "C" represents a result of a conventional capacitor in which a terminal is soldered to a capacitor element.

As can be seen from FIG. 8, in the conventional capacitors, as the peel strength of the terminal is improved, dielectric loss tangent $\tan\delta$ is considerably increased. In this case, while $\tan\delta$ is maintained to be a small value (1% or less), the peel strength of the terminal is as low as 2 to 3 kg. In contrast to this, in the capacitor of the present invention, even if the peel strength of the terminal is increased to be higher than 10 kg, dielectric loss tangent $\tan\delta$ can be maintained to be a small value.

The reason why the capacitor of the present invention is superior to the conventional capacitors is as follows.

(1) Since the terminal of the present invention has a projection (wire) on its connection surface, and the projection is embedded in an electrode layer of a capacitor element, the projection serves as a wedge to resist a force for peeling the terminal.

(2) During connection of the terminal, since only the electrode layer contacting the projection is locally welded for a very short peripd of time, a heating area becomes very small, and a total heat input required for connection is decreased.

In the first embodiment, a capacitor having a radial type connecting lead terminal (a terminal extends to one side of the device body) has been exemplified. However, the present invention is not limited to this, but can be applied to a capacitor having an axial type connecting lead terminal (a terminal extends in upward and downward directions of the device body).

According to the first embodiment, since the insulator of the capacitor element is not substantially degraded due to heating during terminal connection, the thickness of the electrode layer will be decreased, and the entire capacitor will be rendered small.

Since only a small area of the electrode layer contacting the wire is melted during connection of the strip terminal, a molten metal cannot project or be scattered to the rear surface of the terminal or therearound. For this reason, a variation in dimensions of the capacitor and a degradation of its outer appearance can be effectively prevented.

Furthermore, since the terminal is connected to the electrode layer of capacitor by series spot-welding, a work time required for terminal connection will be shortened, thus improving workability.

Since the terminal and the device body will be aligned using the projection as a target, a terminal connection process will be easily automated, and a capacitor suitable for mass production will be provided.

Figure 9:
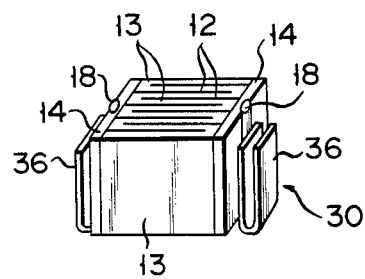
FIG. 9 is a perspective view of a chip type capacitor in which a terminal of the capacitor of the first embodiment is modified to be of a spring type terminal.

FIG. 9 shows a modification of the first embodiment. In this modification, the free end portion of the strip terminal of the first embodiment is bent toward the fixed end portion, so that the terminal shape can be modified from a straight type to a U type functions as a leaf spring. Chip type capacitor 30 having spring type terminal 36 will be mounted only by inserting it in a cavity having an electrode, and does not require a process of soldering, or the like.

Figure 10:
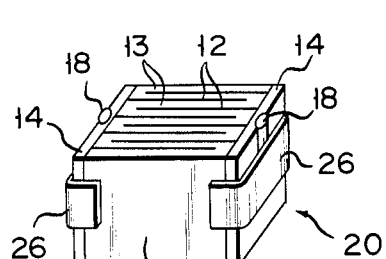
FIG. 10 is a perspective view showing a chip type capacitor according to the second embodiment of the present invention.

A second embodiment of the present invention will be described with reference to FIG. 10. A detailed description of a common portion between the first and second embodiments will be omitted. Plate terminals 26 are respectively connected to a pair of electrode layers 14 of chip type capacitor 20. The longitudinal direction of each terminal 26 corresponds to a stacking direction of capacitor element 12, and its length is slightly larger than a width of a formation surface of each electrode layer 14. The two end portions in the longitudinal direction of each terminal 26 are bent onto a surface adjacent to electrode layer 14. Short wire 18 is mounted at the center of each terminal 26 in the longitudinal direction. The longitudinal direction of each wire 18 is perpendicular to the stacking direction of the capacitor element, and wire 18 is arranged to extend from the lower end portion of terminal 26 to the upper end portion of electrode layer 14. Wire 18 is embedded in corresponding electrode layer 14.

In this case, each plate terminal 26 comprises a Sn-Pb alloy-plated brass plate, and has a thickness of about 0.15 mm, a width of about 3 mm, and a length of about 5 mm. The thickness of electrode layer 14 is about 0.7 mm.

A case will be described wherein the capacitor of the second embodiment is manufactured. Note that a description of a common portion between the first and second embodiments will be omitted.

In the second embodiment, each terminal 26 is welded to electrode layer 14 in a state wherein one end portion of wire 18 extends from a device body. More specifically, plate terminal 26 is welded to wire 18 which is not yet cut (step 40), and terminal 26 and the device body are aligned on a table of a series spot welding machine without cutting off the extending portion of wire 18 (step 44). In this case, the aligning direction of parallel welding tips of the welding machine coincides with the extending direction of wire 18. Thus, when the parallel welding tips are moved downward, one welding tip is in contact with wire 18, and the other welding tip is in contact with terminal 26.

After terminal 26 is welded to electrode layer 14 of the capacitor element (step 45), a part agent (lubricant) consisting of a solvent of an organic fluorine-based resin is applied to terminals 26 (step 46).

The capacitor body is dipped in a bath storing a liquid epoxy resin while holding the free ends of a pair of wires 18, so as to coat the capacitor body with the resin (step 47).

When the coated resin is semi-hardened, the resin attached to terminals 26 are removed. After the resin is satisfactorily hardened, wires 18 are cut at the edge of the capacitor body, thereby removing the extending portion of wires 18 (step 48).

The two end portions of each terminal 26 are bent along a surface adjacent to the electrode layer (step 49). In this manner, chip type capacitor 20 shown in FIG. 10 is completed.

Note that the order of cutting of the wire (step 48) and bending of the terminal (step 49) is not limited to that in this embodiment. The wire may be cut off to have a predetermined length before welding (step 45), or the terminal may be bent in advance.

FIGS. 11 to 14 respectively show terminals with modified projections in the second embodiment.

Figure 11:
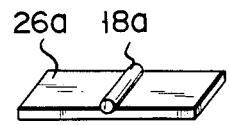
FIGS. 11 to 14 are perspective views respectively showing terminals having projections subjected to various modifications of the chip type capacitor according to the second embodiment.

As shown in FIG. 11, wire 18a may be designed to have a length equal to the width of terminal 26a. With this structure, the wire is not easily bent before terminal connection, and the wire will be reliably embedded in the electrode layer.

Figure 12:

As shown in FIG. 12, projection 27 having a triangular cross-section can be formed along the widthwise direction of terminal 26b at the center thereof. In this case, the cross-sectional shape of projection 27 is not limited to triangle but can be a semi-circular shape or a rectangular shape. With this structure, since the projection is preformed on the terminal, the wire welding process and the cutting process will be omitted, and the entire processes in the manufacture of the capacitor will be shortened.

Figure 13:
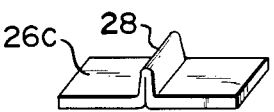

As shown in FIG. 13, terminal 26c is bent at 180° at substantially the center thereof, and thereafter, the two side flat portions are bent back at 90° to leave the central bent portion, thus forming projection 28 at the central portion of terminal 26c.

Figure 14:
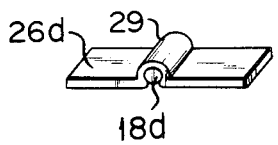
Figure 15:
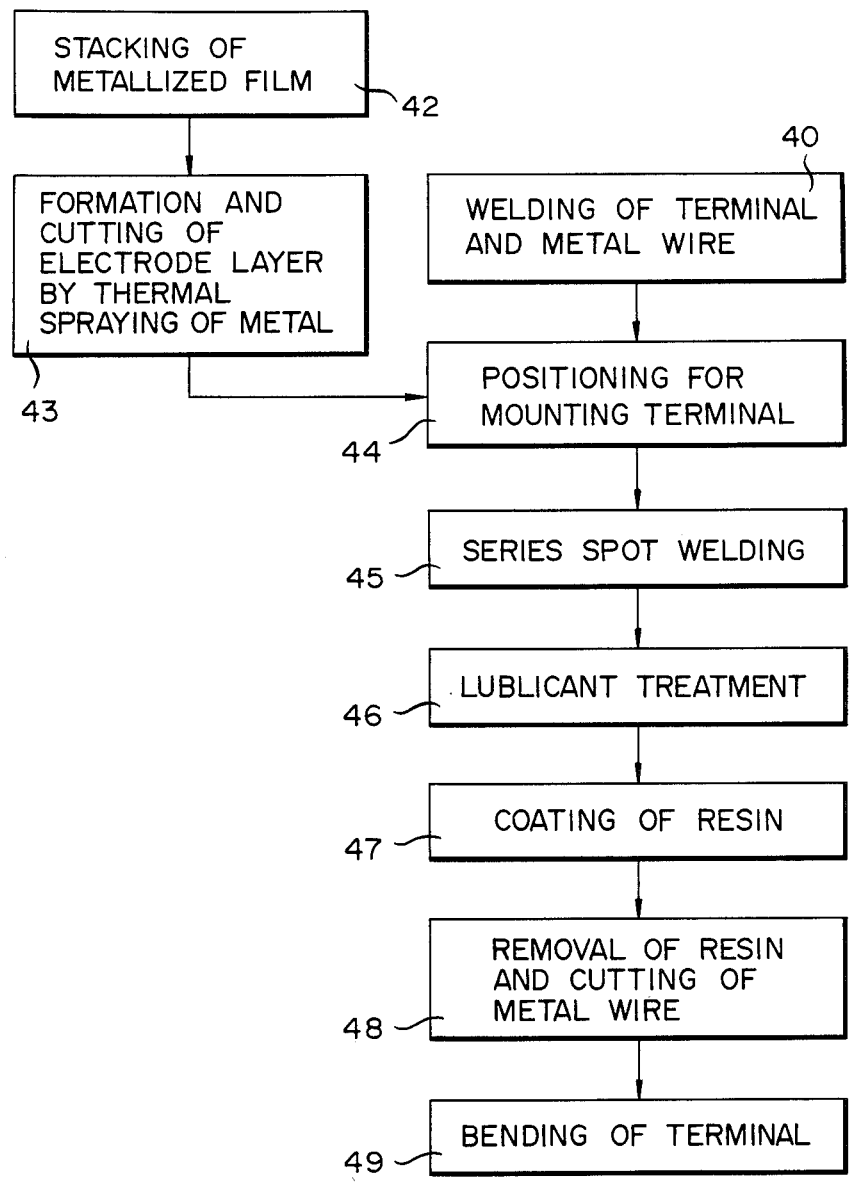
FIG. 15 is a chart showing the steps in the manufacture of the capacitor according to the second embodiment.

As shown in FIG. 14, terminal 26d is bent to be wound around wire 18d to form projection 29 at the central portion of terminal 26c. With this structure, the bending process of the terminal will be facilitated.

In the above embodiments, the capacitor has been exemplified as an electronic device. However, the present invention is not limited to this, but can be applied to other electronic devices, such as a resistor.

As has been described above, according to the present inventon, a total heat input upon terminal connection is suppressed to minimize the influence of heat to the device body. In addition the terminal and the device body can be connected with high strength. For this reason, since the thickness of the electrode layer can be decreased while maintaining dielectric loss tangent tan$\delta$ and the peel strength of the terminal to be desired values, a small, high-quality electronic device will be provided. Furthermore, when a device is manufactured, the terminal and the device body will be easily aligned using a projection formed of the terminal as a target. Therefore, an electronic device suitable for mass production will be provided.

What is claimed is:

1. An electronic device comprising:
   a device body;
   an insulator formed on at least one part of the outer surface of said device body;
   a pair of electrode layers formed of conductive material and laid on said insulator; and
   a pair of plate or strip terminals having flat surfaces overlaid on said electrode layers, respectively and connected to said device body, wherein
   each of said terminals has a projection projecting from the flat surface, is embedded in said electrode layer, and is formed of conductive material having a higher melting point than that of said electrode layer.

2. The electronic device according to claim 1, wherein each of said terminals is connected to the corresponding electrode layer by means of series spot-welding.

3. The electronic device according to claim 1, wherein said projection comprises a metal wire welded to the flat surface of said terminal.

4. The electronic device according to claim 3, wherein said metal wire is connected to said terminal by direct spot-welding.

5. The electronic device according to claim 1, wherein each of said projections is provided at the central portion in the widthwise direction of said terminal.

6. The electronic device according to claim 1, wherein each of said projections is provided at the central portion of said terminal.

7. The electronic device according to claim 6, wherein said projection extends from one end portion to the other end portion in the widthwise direction of said terminal.

8. The electronic device according to claim 1, wherein each of said projections is formed by bending said terminal into a U shape.

9. The electronic device according to claim 1, wherein each of said projections is formed by bending the terminal around the outer surface of said wire.

10. The electronic device according to claim 1, wherein said terminal has one free end portion extending in the longitudinal direction of said terminal.

11. The electronic device according to claim 10, wherein the free end portion of said terminal is bent toward a fixed end portion, so that said terminal functions as a leaf spring.

12. The electronic device according to claim 1, wherein said terminal has two free end portions extending in the longitudinal direction of said terminal.

13. The electronic device according to claim 1, wherein said device body comprises a capacitor element.

14. The electronic device according to claim 13, wherein said device body comprises a square capacitor element.

15. The electronic device according to claim 14, wherein two end portions of said terminal are bent onto two surfaces adjacent to said electrode layer.

16. The electronic device according to claim 14, wherein said device body comprises a stacked film type capacitor element.

17. The electronic device according to claim 13, wherein said device body comprises a round capacitor element.

* * * * *